(12) United States Patent
Xiao et al.

(10) Patent No.: US 8,674,779 B2
(45) Date of Patent: Mar. 18, 2014

(54) REFERENCE CURRENT GENERATOR CIRCUIT

(75) Inventors: Ming Xiao, Shenzhen (CN); Jian Wang, Shenzhen (CN); Jun Yi, Shezhen (CN)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 13/332,564

(22) Filed: Dec. 21, 2011

(65) Prior Publication Data

US 2013/0162358 A1    Jun. 27, 2013

(51) Int. Cl.
*H03B 5/04* (2006.01)
(52) U.S. Cl.
USPC ............ 331/176; 331/34; 331/66; 331/183
(58) Field of Classification Search
USPC .................. 331/111, 143, 34, 16, 185, 176
See application file for complete search history.

(56) References Cited

U.S. PATENT DOCUMENTS 8,242,852 B2 *  8/2012  Denier .......................... 331/111
8,305,068 B2 * 11/2012  Camacho Galeano
                       et al. ............................. 323/313

* cited by examiner

*Primary Examiner* — Arnold Kinkead
(74) *Attorney, Agent, or Firm* — William B. Kempler; Wade J. Brady, III; Frederick J. Telecky, Jr.

(57) ABSTRACT

One aspect of the present invention includes a reference current generator circuit. The circuit includes a bias circuit configured to generate a reference current along a first current path and a second current along a second current path. The reference current and the second current can be proportional. The circuit also includes a first pair of transistors connected in series and configured to conduct the reference current in the first current path. The circuit further includes a second pair of transistors connected in series and configured to conduct the second current in the second current path. The second pair of transistors can be coupled to the first pair of transistors to provide a collective resistance value of the second pair of transistors that is proportional to temperature.

19 Claims, 4 Drawing Sheets

REFERENCE CURRENT GENERATOR CIRCUIT

TECHNICAL FIELD

The present invention relates generally to electronic circuits, and specifically to a reference current generator circuit.

BACKGROUND

In electronic circuit design, it is typical for an electronic circuit to operate based on a reference signal, such as a reference voltage or a reference current. As an example, reference currents can be used to set bias magnitudes for certain components of the electronic circuit. In order for the electronic circuit to operate accurately and efficiently, it is often necessary for the reference signal to likewise be generated accurately, such that the magnitude of the reference signal is substantially stable. As an example, for a reference current that is generated to bias an oscillator circuit, transients in the magnitude of the reference current can result in frequency drift of the oscillator circuit. However, process and environmental considerations, such as temperature changes, can change the magnitude of the reference signal, thus rendering the electronic circuit less accurate, and can be difficult to prevent.

SUMMARY

One aspect of the present invention includes a reference current generator circuit. The circuit includes a bias circuit configured to generate a reference current along a first current path and a second current along a second current path. The reference current and the second current can be proportional. The circuit also includes a first pair of transistors connected in series and configured to conduct the reference current in the first current path. The circuit further includes a second pair of transistors connected in series and configured to conduct the second current in the second current path. The second pair of transistors is coupled to the first pair of transistors to provide a collective resistance value of the second pair of transistors that is proportional to temperature.

Another embodiment of the present invention includes an oscillator circuit. The oscillator circuit includes a reference current source configured to generate a reference current having a substantially constant magnitude with respect to temperature and a current minor circuit configured to generate a charging current and a bias current based on the reference current. The oscillator circuit also includes a capacitor-connected transistor coupled to an oscillator node that is charged by the charging current to generate an oscillator signal and a comparator that is biased by the bias current and is configured to compare the oscillator signal with a reference voltage. The oscillator circuit further includes a discharge transistor that is activated in response to the oscillator signal being greater than the reference voltage to discharge the capacitor-connected transistor. The reference current generator circuit, the current mirror, the capacitor-connected transistor, the comparator, and the discharge transistor can all be process-matched during fabrication such that the oscillator signal is substantially constant with respect to temperature.

Another embodiment of the present invention includes a reference current generator circuit. The circuit includes a bias circuit configured to generate a reference current along a first current path and a second current along a second current path. The reference current and the second current can be proportional. The circuit includes a first pair of transistors that are diode-connected in series and configured to conduct the reference current in the first current path. The circuit also includes a second pair of transistors connected in series and configured to conduct the second current in the second current path. The second pair of transistors can each have a control terminal that is coupled to a respective control terminal of one of the first pair of transistors. The second pair of transistors can provide a collective resistance value of the second pair of transistors that is proportional to temperature. The circuit further includes a proportional to absolute temperature (PTAT) voltage source configured to generate a PTAT voltage at a node in the second current path, such that the reference current has a magnitude that is based on the magnitude of the PTAT voltage and is substantially constant with respect to temperature.

Another embodiment of the present invention includes a method for generating a reference current having a substantially constant magnitude with respect to temperature. The method includes conducting a reference current along a first current path comprising a first plurality of transistors connected in series. The method also includes conducting a second current along a second current path comprising a second plurality of transistors connected in series. The second plurality of transistors can be coupled to the first plurality of transistors to provide a collective resistance value of the second plurality of transistors that is proportional to temperature. The method further includes providing a proportional to absolute temperature (PTAT) voltage at a node in the second current path to set a substantially constant magnitude of the reference current based on the magnitude of the PTAT voltage.

DETAILED DESCRIPTION

Figure 1:
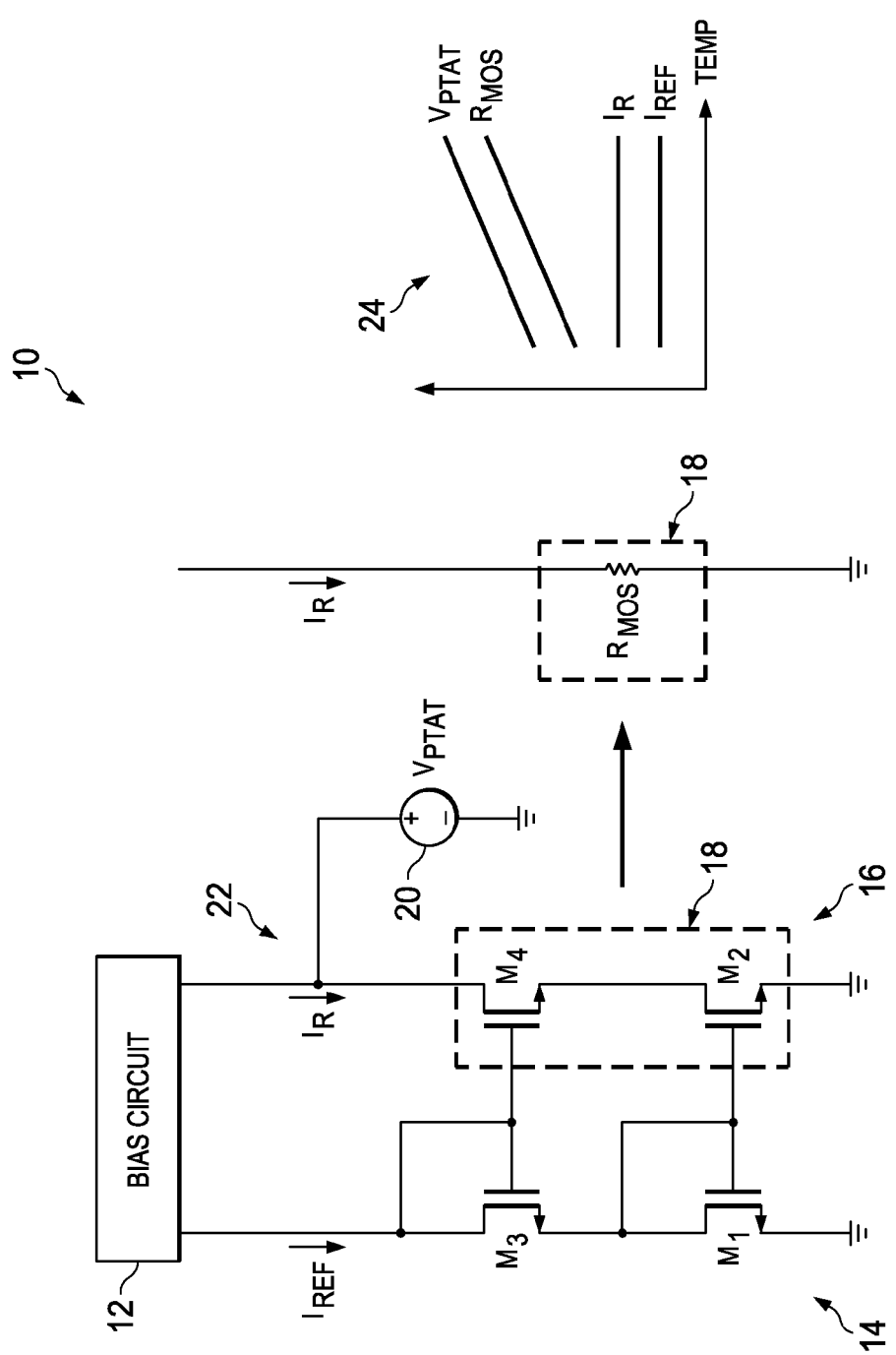
FIG. 1 illustrates an example of a reference current generator circuit in accordance with an aspect of the invention.

The present invention relates generally to electronic circuits, and specifically to a reference current generator circuit. The reference current generator circuit includes a bias circuit that generates a reference current along a first current path and a second current along a second current path. The first current path includes a first pair of transistors that are diode-connected in series to conduct the reference current. The second current path includes a second pair of transistors that are coupled in series to conduct the second current. Each transistor of the second pair of transistors has a control terminal that is coupled to a control terminal of a respective one of the first pair of transistors. As defined herein, the term "control terminal" is used to describe an activation terminal of a transistor, such as a gate of a metal oxide semiconductor field effect transistor (MOSFET) or a base of bipolar junction transistor (BJT). Thus, based on the coupling of the second pair of transistors to the first pair of transistors, and based on a size of the second pair of transistors relative to the first pair of transistors, the second pair of transistors is configured to operate as a resistor having a resistance value that is proportional to temperature. Additionally, the reference current generator can be fabricated such that all of the circuit components can be process-matched. Therefore, the reference current is correlated with an oxide thickness $T_{OX}$ of the second pair of transistors. As provided herein, correlation with the oxide thickness describes a substantial dependence on the oxide thickness with respect to the magnitude of the resistance, and thus the magnitude of the reference current.

The reference current generator circuit can thus include a proportional to absolute temperature (PTAT) voltage source that provides a PTAT voltage at a node in the second current path to set a substantially constant magnitude of the reference current as a function of temperature. Accordingly, the reference current can be provided as a temperature independent current reference for a variety of electronic circuits.

As one example, the reference current can be implemented in an oscillator circuit. The oscillator circuit can include the reference current generator circuit, and can also include a capacitor-connected transistor (e.g., a MOS capacitor) that is charged by a charging current that is generated based on the reference current, such as via the current mirror. The capacitor-connected transistor can thus generate an oscillator voltage at an oscillator node. A comparator can be configured to compare the oscillator voltage with a reference voltage. The comparator can be biased by a bias current that is generated based on the reference current, such as via the current mirror. Upon the oscillator voltage being greater than the reference voltage, the comparator activates a discharge transistor to couple the oscillator node to ground, thus discharging the capacitor-connected transistor. Therefore, based on the charging of the capacitor-connected transistor via the charging current that is mirrored from the reference current, and based on the comparator being biased via the bias current that is likewise mirrored from the reference current, the oscillator circuit can generate the oscillator signal at an accurate frequency that is independent of temperature and substantially independent of process.

FIG. 1 illustrates an example of a reference current generator circuit 10 in accordance with an aspect of the invention. The reference current generator circuit 10 can be implemented in a variety of electronic circuits to provide a stable reference current $I_{REF}$ that is substantially constant with respect to temperature. The reference current generator circuit 10 includes a bias circuit 12 that is configured to generate the reference current $I_{REF}$ along a first current path 14 and a current $I_R$ along a second current path 16. The bias circuit 12 can be configured as a current minor, such that the reference current $I_{REF}$ and the current $I_R$ can be mirrored versions of each other. As a result, the reference current $I_{REF}$ and the current $I_R$ can have magnitudes that are proportional with respect to each other. For example, the reference current $I_{REF}$ can be approximately equal to $K*I_R$, where K is a proportionality constant that can be based on relative characteristics of the first and second current paths 14 and 16, such as within the bias circuit 12. As another example, the reference current $I_{REF}$ can be approximately equal to the current $I_R$.

The first current path 14 includes a transistor $M_1$ and a transistor $M_3$ and the second current path 16 includes a transistor $M_2$ and a transistor $M_4$. The transistors $M_1$ through $M_4$ are demonstrated in the example of FIG. 1 as N-type metal oxide semiconductor field effect transistors (MOSFETs). The transistors $M_1$ and $M_3$ are demonstrated as diode-connected, such that each of the transistors $M_1$ and $M_3$ has a gate that is coupled to a drain, and are coupled in series. As a result, the reference current $I_{REF}$ flows through the transistors $M_1$ and $M_3$ along the first current path 14. The transistors $M_2$ and $M_4$ are likewise coupled in series, while the transistor $M_2$ has a gate that is coupled to the gate of the transistor $M_1$ and the transistor $M_4$ has a gate that is coupled to the gate of the transistor $M_3$. As a result, the gate voltages of the transistors $M_1$ and $M_2$ are approximately equal, and are approximately equal to the drain voltage of the transistor $M_1$. Similarly, the gate voltages of the transistors $M_3$ and $M_4$ are approximately equal, and are approximately equal to the drain voltage of the transistor $M_3$.

The sizes of the transistors $M_1$ and $M_3$ can be different relative to the sizes of the transistors $M_2$ and $M_4$. For example, the transistors $M_2$ and $M_4$ can have a size that is greater than the size of the transistors $M_1$ and $M_3$. Thus, based on the sizes of the transistors $M_2$ and $M_4$ relative to the sizes of the transistors $M_1$ and $M_3$, and based on the coupling of the transistors $M_2$ and $M_4$ to the respective transistors $M_1$ and $M_3$, the transistors $M_2$ and $M_4$ are collectively configured as an equivalent resistor $R_{MOS}$ through which the current $I_R$ flows, demonstrated at 18. As described in greater detail herein, the equivalent resistor $R_{MOS}$ has a resistance value that is proportional with respect to temperature and which is correlated with an oxide thickness $T_{OX}$ of the transistors $M_2$ and $M_4$. The oxide thickness $T_{OX}$ can be substantially well-controlled in modern semiconductor fabrication processes (e.g., approximately +/−7%). Therefore, the magnitude of the current $I_R$ that flows through the equivalent resistor $R_{MOS}$ can have a magnitude that is likewise correlated with the oxide thickness $T_{OX}$ of the transistors $M_2$ and $M_4$.

Furthermore, it is to be understood that the bias circuit 12 and the transistors $M_1$ through $M_4$ can all be fabricated in a substantially process-matched manner. For example, the bias circuit 12 and the transistors $M_1$ through $M_4$ can all be fabricated on the same wafer and/or in the same region of the wafer during fabrication. Therefore, the bias circuit 12 and the transistors $M_1$ through $M_4$ can be substantially free from process variations relative to each other. Accordingly, variations of the resistance of the resistor $R_{MOS}$, and thus the currents $I_R$ and $I_{REF}$, as a result of process variation can be substantially mitigated.

Figure 2:
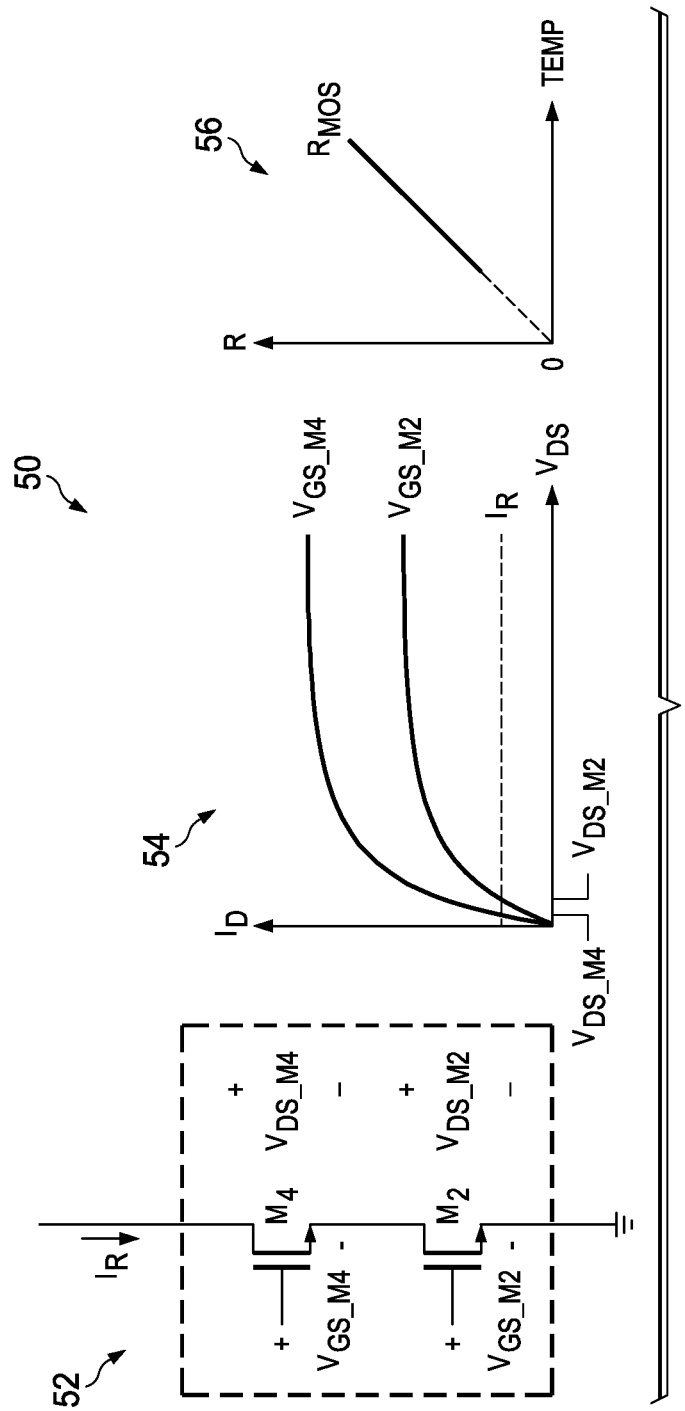
FIG. 2 illustrates an example diagram of a resistor in accordance with an aspect of the invention.

FIG. 2 illustrates an example diagram 50 of a resistor in accordance with an aspect of the invention. The example diagram 50 includes a diagram 52 that demonstrates the series connection of the transistors $M_2$ and $M_4$ that corresponds to the resistor $R_{MOS}$, and also includes a graph 54 that demonstrates the bias voltage of the transistors $M_2$ and $M_4$, as well as the current $I_R$, plotted as a function of drain-source voltage $V_{DS}$ based on a magnitude of drain current $I_D$. Therefore, reference is to be made to the example of FIG. 1 in the following description of the example of FIG. 2. As defined herein, the term "bias voltage" is used to describe an activation voltage of a transistor, demonstrated as gate source voltages $V_{GS\_M2}$ and $V_{GS\_M4}$, respectively, in the example of FIG. 2. However, it is to be understood that the resistor $R_{MOS}$ is not intended to be limited to MOSFETs, such that biasing techniques other than implementing a gate-source voltage can be implemented.

The graph 54 demonstrates that the gate-source voltage $V_{GS\_M4}$ of the transistor $M_4$ is greater than the gate-source voltage $V_{GS\_M2}$ of the transistor $M_2$. As an example, the transistor $M_4$ can have a gate size that is greater than the gate size of the transistor $M_2$. As a result, the coupling of the transistors $M_2$ and $M_4$ to the respective transistors $M_1$ and $M_3$, as well as the current flows of the currents $I_{REF}$ and $I_R$ through the transistor pair $M_1$ and $M_3$ and the transistor pair $M_2$ and $M_4$, respectively, can result in the gate-source voltage $V_{GS\_M4}$ being greater than the gate-source voltage $V_{GS\_M2}$. In addition, the gate sizes of the transistors $M_2$ and $M_4$ can both be greater than the gate sizes of the transistors $M_1$ and $M_3$. As a result, while the transistors $M_1$ and $M_3$ can operate in a saturation region in response to the flow of the current $I_{REF}$, the graph 54 demonstrates that the transistors $M_2$ and $M_4$ operate in the triode region in response to the flow of the current $I_R$. However, because of the difference in magnitudes of the gate-source voltages $V_{GS\_M2}$ and $V_{GS\_M4}$, and because the flow of the current $I_R$ is equal through both of the transistors $M_2$ and $M_4$, the transistor $M_4$ operates deeper in the triode region than the transistor $M_2$, such that a drain-source voltage $V_{DS\_M2}$ across the transistor $M_2$ is greater than the drain-source voltage $V_{DS\_M4}$ across the transistor $M_4$. Accordingly, the series combination of the transistors $M_2$ and $M_4$ provide offsetting temperature coefficients with respect to the current $I_R$, such that the non-linear effects of temperature on a given one of the transistors $M_2$ and $M_4$ is offset by approximately equal and opposite effects of the temperature on the other of the transistors $M_2$ and $M_4$. Accordingly, the resistor $R_{MOS}$ has a resistance that is substantially proportional with respect to temperature, and which is correlated with an oxide thickness $T_{OX}$ of the transistors $M_2$ and $M_4$.

The resistance of the resistor $R_{MOS}$ is demonstrated in the example of FIG. 2 as plotted as a function of temperature TEMP at a graph 56. The graph 56 demonstrates that the resistance of the resistor $R_{MOS}$ increases linearly with respect to temperature. Therefore, based on the configuration of the resistor $R_{MOS}$, as described above, the resistance of the resistor $R_{MOS}$ has a magnitude that is proportional with temperature.

Referring back to the example of FIG. 1, the reference current generator circuit 10 also includes a proportional to absolute temperature (PTAT) voltage source 20 that generates a PTAT voltage $V_{PTAT}$. The voltage $V_{PTAT}$ is provided to a node 22, which is demonstrated in the example of FIG. 1 as interconnecting the resistor $R_{MOS}$ and the bias circuit 12. As an example, the PTAT voltage source 20 can be fabricated in a process-matched manner with the bias circuit 12 and the transistors $M_1$ through $M_4$. Therefore, the voltage $V_{PTAT}$ can have a magnitude that is substantially proportional with respect to temperature. Accordingly, because the resistor $R_{MOS}$ has a resistance that is likewise proportional with respect to temperature, the voltage $V_{PTAT}$ can be provided to set a substantially constant magnitude of the current $I_R$.

The relationship between the voltage $V_{PTAT}$, the resistance of the resistor $R_{MOS}$, and the current $I_R$ is demonstrated as plotted as a function of temperature TEMP at a graph 24. The graph 24 demonstrates that the voltage $V_{PTAT}$ and the resistance of the resistor $R_{MOS}$ both increase linearly with respect to temperature. Therefore, based on the relationship of the voltage $V_{PTAT}$, the resistance of the resistor $R_{MOS}$, and the current $I_R$, the current $I_R$ has a magnitude that is substantially constant as a function of temperature. Thus, because the current $I_R$ is mirrored by the bias circuit 12, the reference current $I_{REF}$ likewise has a magnitude that is substantially constant as a function of temperature, and which is mainly correlated with an oxide thickness $T_{OX}$ of the transistors $M_2$ and $M_4$. Accordingly, the reference current generator circuit 10 can be implemented to provide the reference current $I_{REF}$ as a substantially stable and constant reference current source for other circuitry, such that the other circuitry can operate in an accurate manner regardless of temperature variation.

Figure 3:
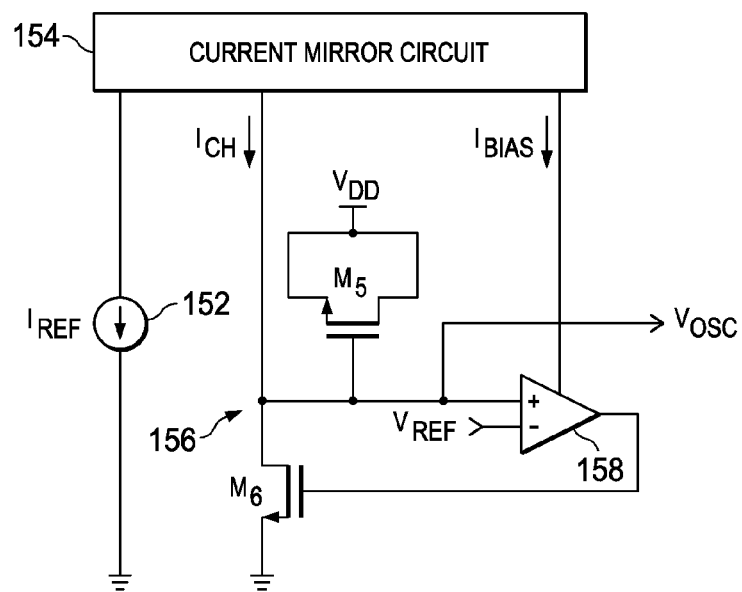
FIG. 3 illustrates an example of an oscillator circuit in accordance with an aspect of the invention.

FIG. 3 illustrates an example of an oscillator circuit 150 in accordance with an aspect of the invention. The oscillator circuit 150 is configured to generate an oscillator signal $V_{OSC}$ that can be implemented in a variety of different circuit applications, such as a switching power supply. The oscillator circuit 150 includes a current source 152 that is configured to generate a reference current $I_{REF}$ and a current mirror circuit 154. The current source 152 can correspond to the first and second current paths 14 and 16 and the current minor circuit 154 can be associated with the bias circuit 12 in the examples of FIGS. 1 and 3, such that it can incorporate at least portions of the bias circuit 12. Therefore, reference is to be made to the examples of FIGS. 1 and 2 in the following description of the example of FIG. 3.

As described above regarding the examples of FIG. 1, the reference current $I_{REF}$ can be substantially constant as a function of temperature. As an example, the reference current $I_{REF}$ can have a substantially fixed magnitude that is substantially invariant with respect to temperature based on the PTAT voltage source 22 in the example of FIG. 1. The current minor circuit 154 can be configured to generate a charging current $I_{CH}$ and a bias current $I_{BIAS}$ based on the reference current $I_{REF}$. Therefore, the charging current $I_{CH}$ and the bias current $I_{BIAS}$ likewise have magnitudes that are substantially constant as a function of temperature.

The oscillator circuit 150 includes a transistor $M_5$ that is capacitor-connected, such that it is demonstrated in the example of FIG. 3 as having a source and a drain that are coupled together and are coupled to a supply voltage $V_{DD}$. Thus, the capacitor-connected transistor $M_5$ operates in an accumulation or strong inversion mode. As a result, the transistor $M_5$ is configured to operate as a capacitor. The transistor $M_5$ has a gate that is coupled to an oscillator node 156, such that the intrinsic capacitance of the transistor $M_5$ allows the transistor $M_5$ to be charged and discharged to generate the oscillator signal $V_{OSC}$ at the oscillator node 156. The charging of the transistor $M_5$ occurs as a result of the flow of the charging current $I_{CH}$ from the current mirror circuit 154 into the charging node 156.

The oscillator circuit 150 also includes a comparator 158. The comparator 158 is biased via the bias current $I_{BIAS}$ that is generated by the current mirror circuit 154. The comparator 158 has a non-inverting input that is coupled to the oscillator node 156 and an inverting node that is coupled to a reference voltage $V_{REF}$. Therefore, the comparator 158 is configured to compare the oscillator signal $V_{OSC}$ with the reference voltage $V_{REF}$. The comparator 158 has an output that controls a discharge transistor $M_6$ that interconnects the oscillator node 156 and a low voltage rail, demonstrated in the example of FIG. 3 as ground. Thus, while the capacitor-connected transistor $M_5$ is being charged by the charging current $I_{CH}$, the oscillator signal $V_{OSC}$ is less than the reference voltage $V_{REF}$. Therefore, the output of the comparator 158 is logic-low, such that the discharge transistor $M_6$ remains deactivated. Upon the oscillator signal $V_{OSC}$ having a magnitude that is greater than the reference voltage $V_{REF}$, the output of the comparator 158 switches to a logic-high state, thus activating the discharge transistor $M_6$. The transistor $M_6$ thus discharges the charge stored in the capacitor-connected transistor $M_5$ to ground. As a result, the transistor $M_6$ can again be deactivated by the comparator 158, such that the capacitor-connected transistor $M_5$ can begin to charge via the charging current $I_{CH}$ again.

In the example of FIG. 3, the current source 152, the current mirror circuit 154, the capacitor-connected transistor $M_5$, the discharge transistor $M_6$, and the comparator 158 can all be fabricated in a process-matched manner. As a result, the oscillator circuit 150 is substantially free from process variations. Additionally, as described above, because the charging current $I_{CH}$ and the bias current $I_{BIAS}$ are generated based on the reference current $I_{REF}$ via the current minor circuit 154, the charging current $I_{CH}$ and the bias current $I_{BIAS}$ can each have a magnitude that is substantially constant as a function of temperature. Accordingly, the oscillator circuit 150 can be configured to generate the oscillator signal $V_{OSC}$ at an accurate frequency that is substantially constant with respect to temperature, process variation, and power supply.

Figure 4:
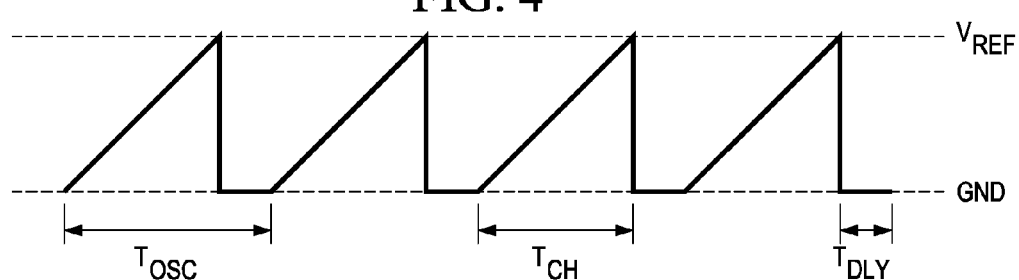
FIG. 4 illustrates an example of an oscillator signal in accordance with an aspect of the invention.

FIG. 4 illustrates an example of an oscillator signal 200 in accordance with an aspect of the invention. The oscillator signal 200 can correspond to the oscillator signal $V_{OSC}$ in the example of FIG. 3, such that reference can be made to the example of FIG. 3 in the following description of the example of FIG. 4. The oscillator signal 200 is demonstrated in the example of FIG. 4 as oscillating between ground GND and the reference voltage $V_{REF}$. The oscillator signal $V_{OSC}$ has a period that is defined by a time $T_{OSC}$ that is substantially constant as a function of temperature. In the example of FIG. 4, the period includes a charging time $T_{CH}$ and a delay time $T_{DLY}$ that collectively define the time $T_{OSC}$.

The charging time $T_{CH}$ is based on the magnitude of the charging current $I_{CH}$, which is substantially constant as a function of temperature, and based on the capacitance of the capacitor-connected transistor $M_5$, which is fabricated in a process-matched manner with the remaining components of the oscillator circuit 150. Therefore, the charging time $T_{CH}$ is substantially constant in each period of the oscillator signal $V_{OSC}$, and is thus unaffected by process and temperature variations. In addition, the delay time $T_{DLY}$ subsequent to the discharge of the capacitor-connected transistor can be based on circuit characteristics of the comparator 158. For example, the comparator 158 can include a logic delay time that is based on an intrinsic capacitance of one or more transistors therein. Because the transistors that form the comparator 158 are fabricated in the same process-matched manner as the remaining components of the oscillator circuit 150, and because the comparator 158 is biased by the bias current $I_{BIAS}$, which is generated based on the reference current $I_{REF}$, the delay time $T_{DLY}$ is likewise substantially constant in each period of the oscillator signal $V_{OSC}$. Accordingly, the frequency of the oscillator signal $V_{OSC}$ can be generated substantially accurately and independently of temperature.

It is to be understood that the oscillator circuit 150 is not intended to be limited to the example of FIG. 3. For example, additional circuit components and/or methodologies can be implemented to generate the oscillator signal $V_{OSC}$. Therefore, the oscillator circuit 150 is not intended to be limited to the specific configuration demonstrated in the example of FIG. 3, but that other types of circuits that are controlled via currents that are substantially constant with respect to temperature and/or fabricated in a process-matched manner can be implemented.

Figure 5:
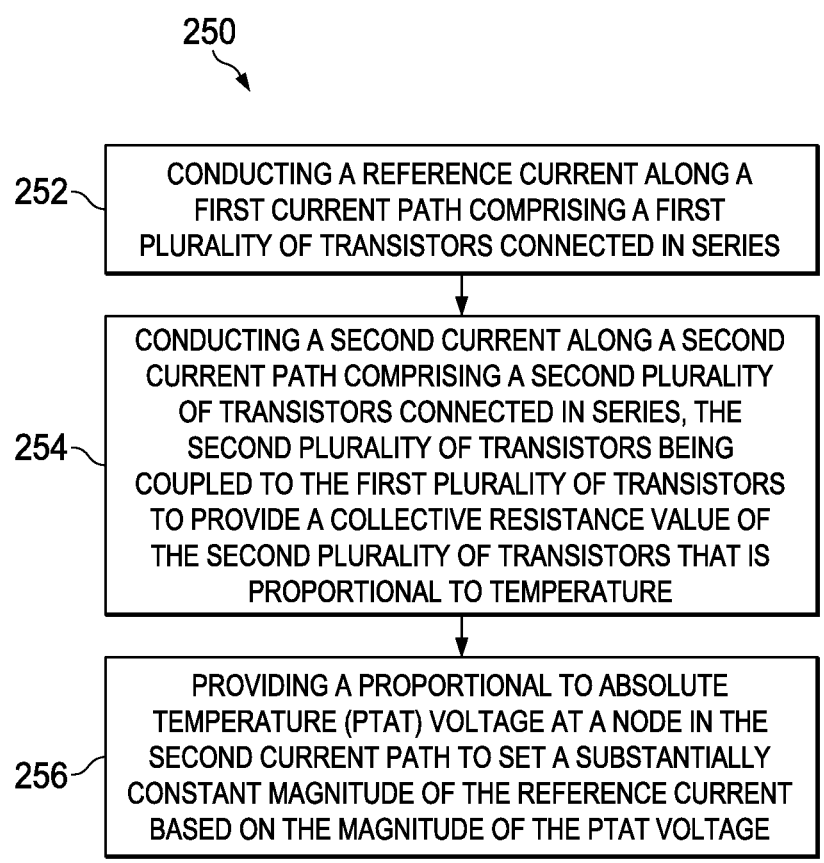
FIG. 5 illustrates a method for generating a reference current having a substantially constant magnitude with respect to temperature in accordance with an aspect of the invention.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method.

FIG. 5 illustrates an example of a method 250 for generating a reference current having a substantially constant magnitude with respect to temperature. At 252, a reference current is conducted along a first current path comprising a first plurality of transistors connected in series. At 254, a second current is conducted along a second current path comprising a second plurality of transistors connected in series, the second plurality of transistors being coupled to the first plurality of transistors to provide a collective resistance value of the second plurality of transistors that is proportional to temperature. At 256, a proportional to absolute temperature (PTAT) voltage is provided at a node in the second current path to set a substantially constant magnitude of the reference current based on the magnitude of the PTAT voltage. The reference current can be generated via the reference current generator circuit 100 in the example of FIG. 1, such that two series transistors act as a resistor having a resistance value that is proportional with respect to temperature and which is correlated with an oxide thickness $T_{OX}$ of the transistors, and a PTAT voltage is implemented to set a magnitude of the reference current that is constant as a function of temperature.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A reference current generator circuit comprising:
   a bias circuit configured to generate a reference current along a first current path and a second current along a second current path, the reference current and the second current being proportional;
   a first pair of transistors connected in series and configured to conduct the reference current in the first current path; and
   a second pair of transistors connected in series and configured to conduct the second current in the second current path, the second pair of transistors being coupled to the first pair of transistors to provide a collective resistance value of the second pair of transistors that is proportional to temperature, wherein each of the first pair of transistors is diode-connected, and wherein each of the second pair of transistors has a control terminal that is coupled to a respective control terminal of one of the first pair of transistors.

2. The circuit of claim 1, further comprising a proportional to absolute temperature (PTAT) voltage source configured to generate a PTAT voltage at a node in the second current path, such that the reference current has a magnitude that is based on the magnitude of the PTAT voltage and is substantially constant with respect to temperature.

3. The circuit of claim 2, wherein the bias circuit, the first pair of transistors, the second pair of transistors, and the PTAT voltage source are all process-matched during fabrication, such that the reference current has a magnitude that is correlated with an oxide thickness associated with at least one of the first and second pairs of transistors.

4. The circuit of claim 1, wherein the second pair of transistors have a larger gate size than the first pair of transistors, such that the first pair of transistors operate in a saturation region and the second pair of transistors operate in a triode region.

5. A reference current generator circuit comprising:
   a bias circuit configured to generate a reference current along a first current path and a second current along a second current path, the reference current and the second current being proportional;
   a first pair of transistors connected in series and configured to conduct the reference current in the first current path; and
   a second pair of transistors connected in series and configured to conduct the second current in the second current path, the second pair of transistors being coupled to the first pair of transistors to provide a collective resistance value of the second pair of transistors that is proportional to temperature, wherein a first transistor of the second pair of transistors has a larger gate size than a second transistor of the second pair of transistors, such that the coupling of the second pair of transistors to the first pair of transistors is such that a bias voltage of the first transistor is greater than a bias voltage of the second transistor, thus resulting in a voltage across the second transistor being greater than a voltage across the first transistor based on the reference current flow through the second pair of transistors.

6. An oscillator circuit comprising the reference current generator circuit of claim 1, the oscillator circuit further comprising:
 a capacitor configured to generate an oscillator voltage in response to being charged and discharged;
 a comparator that is biased by a bias current, the bias current being generated via a current mirror associated with the bias circuit based on the reference current, the comparator being configured to compare the oscillator voltage with a reference voltage; and
 a discharge transistor that is controlled by the comparator to charge and discharge the capacitor via a charging current in response to the magnitude of the oscillator voltage, the charging current being generated via the current mirror based on the reference current, such that oscillation and period delay of the oscillator voltage is independent of temperature.

7. The oscillator circuit of claim 6, wherein the capacitor is configured as a capacitor-connected transistor.

8. The oscillator circuit of claim 7, wherein the reference current generator circuit, the capacitor-connected transistor, the comparator, and the discharge transistor are all process-matched during fabrication, such that the oscillation and period delay of the oscillator voltage are correlated with an oxide thickness associated with at least one of the first and second pairs of transistors.

9. A oscillator circuit comprising:
 a reference current source configured to generate a reference current having a substantially constant magnitude with respect to temperature;
 a current mirror circuit configured to generate a charging current and a bias current based on the reference current;
 a capacitor-connected transistor coupled to an oscillator node that is charged by the charging current to generate an oscillator signal;
 a comparator that is biased by the bias current and is configured to compare the oscillator signal with a reference voltage; and
 a discharge transistor that is activated in response to the oscillator signal being greater than the reference voltage to discharge the capacitor-connected transistor, wherein the reference current generator circuit, the current mirror, the capacitor-connected transistor, the comparator, and the discharge transistor are all process-matched during fabrication such that the oscillator signal is substantially constant with respect to temperature, wherein the reference current source comprises:
 a bias circuit configured to generate the reference current along a first current path and a second current along a second current path, the reference current and the second current being proportional;
 a first pair of transistors connected in series that forms a first current path through which the reference current flows;
 a second pair of transistors connected in series that forms a second current path through which the second current flows, the second pair of transistors being coupled to the first pair of transistors to provide a collective resistance value of the second pair of transistors that is proportional to temperature, and wherein each of the first pair of transistors are configured as diode-connected, and wherein a control terminal associated with each of the second pair of transistors is coupled to a respective control terminal of one of the first pair of transistors.

10. The circuit of claim 9, wherein the reference current source further comprises a proportional to absolute temperature (PTAT) voltage source at a node in the second current path to set a substantially constant magnitude of the reference current based on the magnitude of the PTAT voltage.

11. The circuit of claim 9, wherein the first pair of transistors are operated in a saturation region, and wherein the second pair of transistors are operated in a triode region with a first transistor of the second pair of transistors having a higher bias voltage than a second transistor of the second pair of transistors, such that a voltage across the second transistor is greater than a voltage across the first transistor based on the reference current through the second pair of transistors.

12. The circuit of claim 9, wherein the comparator is configured to add a delay time to the oscillator signal subsequent to discharging the capacitor-connected transistor, the delay time being substantially constant in each period of the oscillator signal based on characteristics of the comparator.

13. A reference current generator circuit comprising:
 a bias circuit configured to generate a reference current along a first current path and a second current along a second current path, the reference current and the second current being proportional;
 a first pair of transistors that are diode-connected in series and configured to conduct the reference current in the first current path; and
 a second pair of transistors connected in series and configured to conduct the second current in the second current path, the second pair of transistors each having a control terminal that is coupled to a respective control terminal of one of the first pair of transistors, the second pair of transistors providing a collective resistance value of the second pair of transistors that is proportional to temperature; and
 a proportional to absolute temperature (PTAT) voltage source configured to generate a PTAT voltage at a node in the second current path, such that the reference current has a magnitude that is based on the magnitude of the PTAT voltage and is substantially constant with respect to temperature, wherein a first transistor of the second pair of transistors has a larger gate size than a second transistor of the second pair of transistors, such that the coupling of the second pair of transistors to the first pair of transistors is such that a bias voltage of the first transistor is greater than a bias voltage of the second transistor, thus resulting in a voltage across the second transistor being greater than a voltage across the first transistor based on the reference current flow through the second pair of transistors.

14. The circuit of claim 13, wherein the second pair of transistors have a larger gate size than the first pair of transistors, such that the first pair of transistors operate in a saturation region and the second pair of transistors operate in a triode region.

15. An oscillator circuit comprising the reference current generator circuit of claim 13, the oscillator circuit further comprising:
 a capacitor-connected transistor configured to generate an oscillator voltage in response to being charged and discharged;

a comparator that is biased by a bias current, the bias current being generated via the current mirror associated with the bias circuit based on the reference current, the comparator being configured to compare the oscillator voltage with a reference voltage; and a discharge transistor that is controlled by the comparator to charge and discharge the capacitor-connected transistor via a charging current in response to the magnitude of the oscillator voltage, the charging current being generated via the current mirror based on the reference current, such that oscillation and period delay of the oscillator voltage is independent of temperature.

16. The oscillator circuit of claim 15, wherein the reference current generator circuit, the capacitor-connected transistor, the comparator, and the discharge transistor are all process-matched during fabrication, such that the oscillation and period delay of the oscillator voltage are correlated with an oxide thickness associated with at least one of the first and second pairs of transistors.

17. A method for generating a reference current having a substantially constant magnitude with respect to temperature, the method comprising:

conducting a reference current along a first current path comprising a first plurality of transistors connected in series;

conducting a second current along a second current path comprising a second plurality of transistors connected in series, the second plurality of transistors being coupled to the first plurality of transistors to provide a collective resistance value of the second plurality of transistors that is proportional to temperature; and providing a proportional to absolute temperature (PTAT) voltage at a node in the second current path to set a substantially constant magnitude of the reference current based on the magnitude of the PTAT voltage, further comprising:

operating the first plurality of transistors in a saturation region; and operating the second plurality of transistors in a triode region with a first transistor of the second plurality of transistors having a higher bias voltage than a second transistor of the second plurality of transistors, such that a voltage across the second transistor is greater than a voltage across the first transistor based on the reference current through the second plurality of transistors.

18. The method of claim 17, wherein each of the first plurality of transistors is diode-connected, and wherein each of the second plurality of transistors has a control terminal that is coupled to a respective control terminal of one of the first plurality of transistors.

19. The method of claim 17, wherein each of the first and second plurality of transistors is arranged as a pair of resistors, and wherein a first transistor of the second pair of transistors has a larger gate size than a second transistor of the second pair of transistors, the method further comprising setting a bias voltage of the first transistor is greater than a bias voltage of the second transistor based on the coupling of the second pair of transistors to the first pair of transistors to set a voltage across the second transistor to be greater than a voltage across the first transistor based on the reference current flow through the second pair of transistors.

* * * * *